(12) United States Patent
Shin

(10) Patent No.: US 7,920,118 B2
(45) Date of Patent: *Apr. 5, 2011

(54) SCAN DRIVING CIRCUIT COMPRISING A PLURALITY OF STAGES, EACH STAGE CONFIGURED TO RECEIVE MULTIPLE CLOCKS

(75) Inventor: Dong Yong Shin, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1042 days.

This patent is subject to a terminal disclaimer.

(21) Appl. No.: 11/692,880

(22) Filed: Mar. 28, 2007

(65) Prior Publication Data

US 2007/0242001 A1 Oct. 18, 2007

(30) Foreign Application Priority Data

Apr. 18, 2006 (KR) .................. 10-2006-0034959

(51) Int. Cl.
*G09G 3/36* (2006.01)
(52) U.S. Cl. ............... 345/99; 345/55; 345/98; 345/100
(58) Field of Classification Search ................... None
See application file for complete search history.

(56) References Cited

U.S. PATENT DOCUMENTS

| | | | | |
|---|---|---|---|---|
| 5,222,082 A | * | 6/1993 | Plus | .................. 377/79 |
| 6,339,631 B1 | | 1/2002 | Yeo et al. | |
| 6,426,743 B1 | | 7/2002 | Yeo et al. | |
| 7,420,536 B2 | | 9/2008 | Jang et al. | |
| 7,679,597 B2 | * | 3/2010 | Shin | .................. 345/100 |
| 2003/0128180 A1 | | 7/2003 | Kim et al. | |
| 2004/0104882 A1 | * | 6/2004 | Kitani et al. | .................. 345/100 |
| 2004/0227718 A1 | | 11/2004 | Park | |
| 2005/0156856 A1 | * | 7/2005 | Jang et al. | .................. 345/100 |

(Continued)

FOREIGN PATENT DOCUMENTS

EP 0 651 395 A2 5/1995

(Continued)

OTHER PUBLICATIONS

European Patent Office Examination Report for Application No. 07 251 408.6-1228 dated Nov. 14, 2008, indicating relevance of cited reference.

(Continued)

*Primary Examiner* — Amare Mengistu
*Assistant Examiner* — Antonio Xavier
(74) *Attorney, Agent, or Firm* — Christie, Parker & Hale, LLP

(57) ABSTRACT

A scan driving circuit and an organic light emitting display using the same. The scan driving circuit includes stages that each includes: a switch for turning on/off a connection of the input terminal according to a first clock among a plurality of clocks, the first clock for inputting through a first clock terminal; a switch section for transferring a first voltage to the output terminal according to the first clock among the three clocks, and for preventing the first voltage from being transferred to the output terminal according to the input signal; and a storage section for maintaining a voltage of the output terminal for a predetermined time, and for transferring a voltage of a second clock among the three clocks to the output terminal according to the input signal, the second clock for inputting through the second clock terminal.

13 Claims, 11 Drawing Sheets

U.S. PATENT DOCUMENTS

| | | | |
|---|---|---|---|
| 2005/0156859 A1* | 7/2005 | Jang et al. | 345/100 |
| 2005/0185752 A1* | 8/2005 | Sasaki et al. | 377/64 |
| 2006/0007085 A1* | 1/2006 | Kim et al. | 345/87 |

FOREIGN PATENT DOCUMENTS

| | | |
|---|---|---|
| EP | 1 764 773 A2 | 3/2007 |
| GB | 2 343 068 A | 4/2000 |
| JP | 07-182891 | 7/1995 |
| JP | 2000-155550 | 6/2000 |
| JP | 2001-160299 | 6/2001 |
| JP | 2003-101394 | 4/2003 |
| JP | 2004-185684 | 7/2004 |
| JP | 2005-94335 | 4/2005 |
| JP | 2005-166139 | 6/2005 |
| JP | 2005-251335 | 9/2005 |
| JP | 2005-302278 | 10/2005 |
| KR | 2002-0085205 | 11/2002 |

OTHER PUBLICATIONS

Patent Abstracts of Japan, Publication No. 2005-094335, dated Apr. 7, 2005, in the name of Takeshi Toyoshima et al.

Patent Abstracts of Japan, Publication No. 2005-302278, dated Oct. 27, 2005, in the name of Minoru Kanbara.

Korean Patent Abstracts, Publication No. 1020020085205, dated Nov. 16, 2002, in the name of Han Sang Lee et al.

Patent Abstracts of Japan, Publication No. 2004-185684; Publication Date: Jul. 2, 2004; in the name of Kitani Masakatsu et al.

Patent Abstracts of Japan, Publication No. 2005-166139; Publication Date: Jun. 23, 2005; in the name of Ozawa Norio et al.

European Search Report dated Jul. 2, 2007, for 07251408.6, in the name of Samsung SDI Co., Ltd.

European Search Report dated Jul. 2, 2007, for European Patent application 07251479.7.

U.S. Notice of Allowance dated Oct. 26, 2009, for cross reference U.S. Appl. No. 11/692,880 (now U.S. Patent 7,679,597).

* cited by examiner

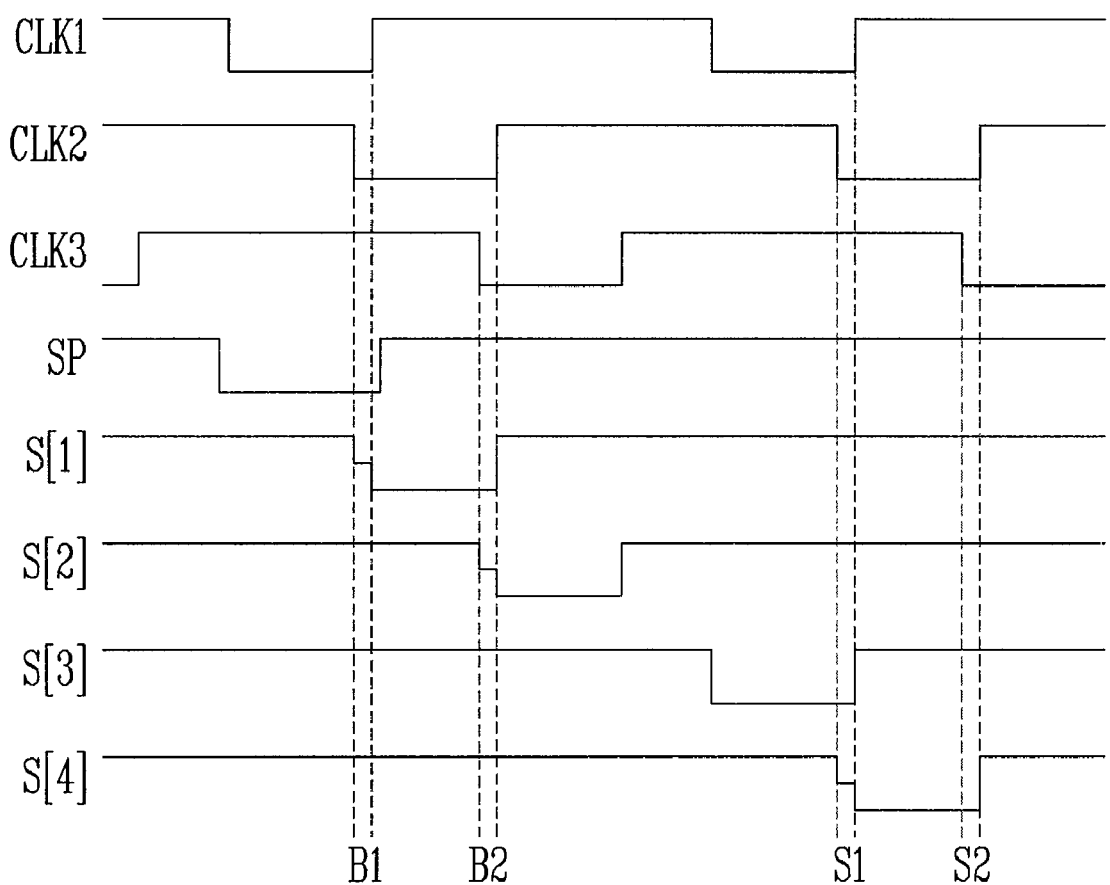

SCAN DRIVING CIRCUIT COMPRISING A PLURALITY OF STAGES, EACH STAGE CONFIGURED TO RECEIVE MULTIPLE CLOCKS

CROSS-REFERENCE TO RELATED APPLICATION

This application claims priority to and the benefit of Korean Patent Application No. 10-2006-0034959, filed on Apr. 18, 2006, in the Korean Intellectual Property Office, the entire content of which is incorporated herein by reference.

BACKGROUND

1. Field of the Invention

The present invention relates to a scan driving circuit and an organic light emitting display using the same.

2. Discussion of Related Art

Recently, various flat panel displays devices with a small weight and volume compared with a cathode ray tube have been developed, and a flat panel display device arranges a plurality of pixels on a substrate in a matrix type to form a pixel unit, and connects scan lines and data lines to each pixel to selectively apply data signals to the pixels for displaying.

The flat panel display device is divided into a passive matrix type display device and an active matrix type display device in accordance with a driving scheme of a pixel. The active matrix type selectively lighting per the unit pixel has mainly been used in view of resolution, contrast and an operation speed.

Such a flat panel display device has been used as a display device of a portable information terminal such as a personal computer, a mobile telephone, a PDA, etc., or a monitor for various information equipments. A LCD using a liquid crystal panel, an organic electro luminescence display using organic light-emitting element and a PDP using a plasma panel, etc., have been known. In particular, the organic electro luminescence display, which is excellent in view of emission efficiency, brightness, view angle and has a rapid response speed, has been spotlighted.

In general, an active matrix type display device such as an organic light emitting display includes a pixel array arranged at crossings between data lines and scan lines in a matrix pattern.

Here, the scan lines include horizontal lines (i.e., row lines) of a matrix display region, and sequentially provide a predetermined signal, namely, a scan signal, from a scan driving circuit, to the pixel array.

SUMMARY OF THE INVENTION

One embodiment of the present invention is a scan driving circuit including a plurality of stages. The plurality of stages being for receiving three clocks, wherein each of the plurality of stages is configured to receive two of the three clocks, to receive and delay an input signal through an input terminal, and to output an output signal through an output terminal, wherein the input terminal of each of the plurality of stages is connected to the output terminal of a previous one of the stages. Each of the plurality of stages includes: a switch for turning on/off a connection of the input terminal according to a first clock among the three clocks, the first clock for inputting through a first clock terminal; a switch section for transferring a first voltage to the output terminal according to the first clock among the three clocks, and for preventing the first voltage from being transferred to the output terminal according to the input signal; and a storage section for maintaining a voltage of the output terminal for a predetermined time, and for transferring a voltage of a second clock among the three clocks to the output terminal according to the input signal, the second clock for inputting through the second clock terminal.

According to a second embodiment of the present invention, there is provided a scan driving circuit including: a plurality of stages, the plurality of stages being for receiving three clocks, wherein each of the plurality of stages is configured to receive two of the three clocks, to receive and delay an input signal through an input terminal, and to output an output signal through an output terminal, wherein the input terminal of each of the plurality of stages is connected to the output terminal of a previous one of the stages. Each of the plurality of stages includes: a first transistor for turning on/off a connection of the input terminal according to a first clock among the three clocks, the first clock for inputting through a first clock terminal; a switch section for transferring a first voltage to the output terminal according to the first clock among the three clocks; and a storage section for maintaining a voltage of the output terminal for a predetermined time, and for transferring a voltage of a second clock among the three clocks to the output terminal according to the input signal, the second clock for inputting through a second clock terminal.

In another embodiment of the invention, an organic light emitting display is provided. The device includes: a display region having a plurality of pixels for displaying an image; a scan driving circuit for transferring a scan signal to the display region; and a data driving circuit for transferring a data signal to the display region. The scan driving circuit includes a plurality of stages, the plurality of stages being for receiving three clocks, wherein each of the plurality of stages is configured to receive two of the three clocks, to receive and delay an input signal through an input terminal, and to output an output signal through an output terminal, wherein the input terminal of each of the plurality of stages is connected to the output terminal of a previous one of the stages. Each of the plurality of stages includes: a transistor for turning on/off a connection of the input terminal according to a first clock among the three clocks, the first clock for inputting through a first clock terminal; a switch section for transferring a first voltage to the output terminal according to the first clock among the three clocks, and for preventing the first voltage from being transferred to the output terminal according to the input signal; and a storage section for maintaining a voltage of the output terminal for a predetermined time, and for transferring a voltage of a second clock among the three clocks to the second clock terminal to the output terminal according to the input signal, the second clock for inputting through a second clock terminal.

In another embodiment of the invention, an organic light emitting display is provided. The device includes: a display region having a plurality of pixels for displaying an image; a scan driving circuit for transferring a scan signal to the display region; and a data driving circuit for transferring a data signal to the display region. The scan driving circuit includes a plurality of stages, the plurality of stages being for receiving three clocks, wherein each of the plurality of stages is configured to receive two of the three clocks, to receive and delay an input signal through an input terminal, and to output an output signal through an output terminal, wherein the input terminal of each of the plurality of stages is connected to the output terminal of a previous one of the stages. Each of the plurality of stages includes: a transistor for turning on/off a connection of the input terminal according to a first clock among the three clocks, the first clock for inputting through a first clock terminal; a switch section for transferring a first voltage to the output terminal according to the first clock among the three clocks; and a storage section for maintaining a voltage of the output terminal for a predetermined time, and for transferring a voltage of a second clock among the three clocks to the output terminal according to the input signal, the second clock for inputting through a second clock terminal.

BRIEF DESCRIPTION OF THE DRAWINGS

These and/or other embodiments and features of the invention will become apparent and more readily appreciated from the following description of certain exemplary embodiments, taken in conjunction with the accompanying drawings of which:

FIG. 10A and FIG. 10B are timing diagrams showing a second embodiment and a third embodiment, respectively, of input/output waveforms of the stages shown in FIG. 8 and FIG. 9, respectively;

DETAILED DESCRIPTION OF EXEMPLARY EMBODIMENTS

Figure 1:
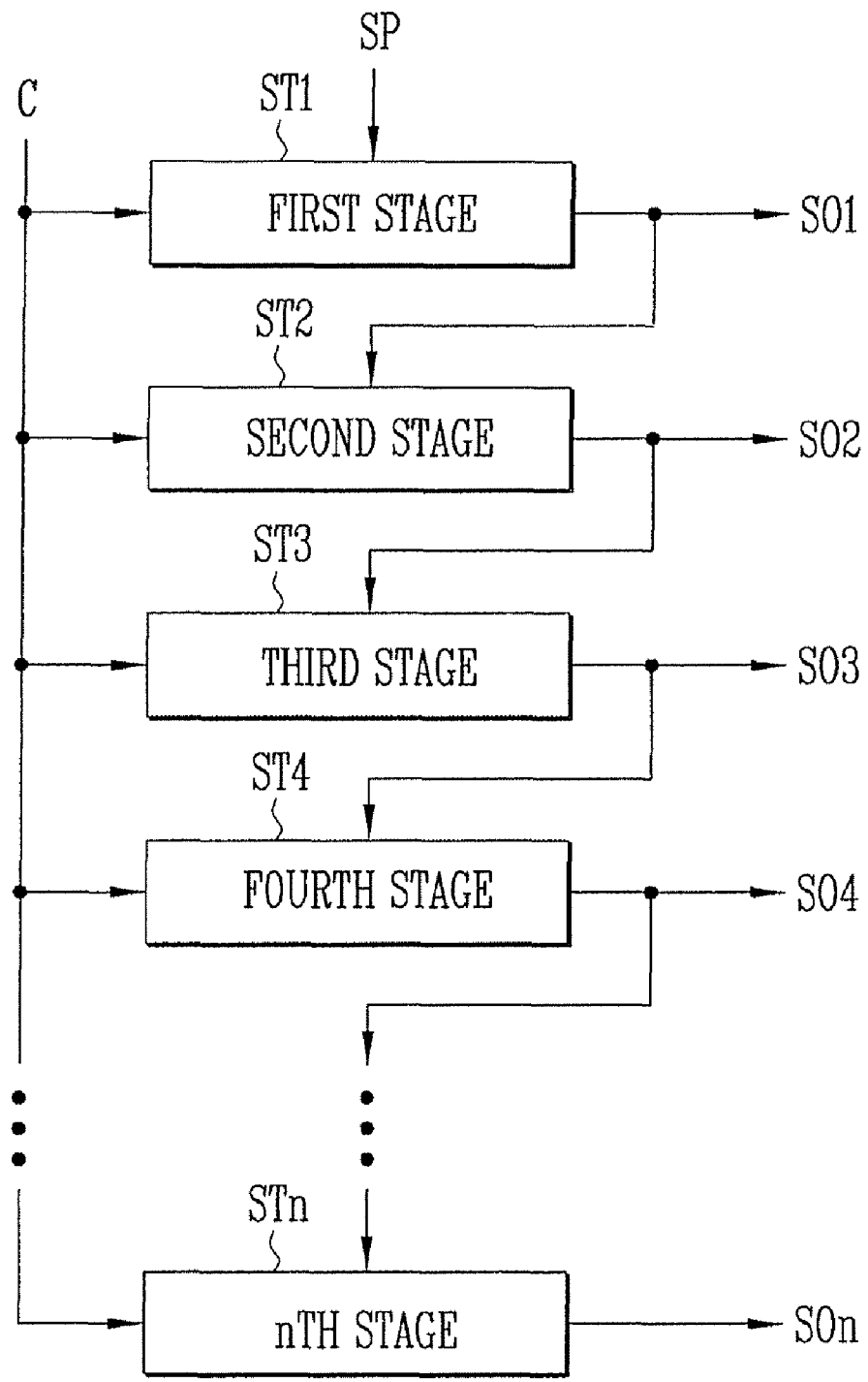
FIG. 1 is a block diagram showing a conventional scan driving circuit.

Hereinafter, certain exemplary embodiments according to the present invention will be described with reference to the accompanying drawings. Here, when a first element is described as being connected to a second element, the first element may be not only directly connected to the second element but may also be indirectly connected to the second element via a third element. Further, elements that are not essential to the complete understanding of the invention are omitted for clarity. Also, like reference numerals refer to like elements throughout.

FIG. 1 is the block diagram showing a conventional scan driving circuit. With reference to FIG. 1, the conventional scan driving circuit includes a plurality of stages ST1 to STn, which are dependently connected with a start pulse SP input line. The plurality of stages ST1 to STn sequentially shift a clock signal C in response to a start pulse SP to generate output signals SO1 to SOn, respectively. In this case, each of second to n-th stages ST2 to STn receives and shifts an output signal of a previous stage as a start pulse.

Accordingly, the stages generate output signals S01 to SOn in such a way that the start pulse is sequentially shifted, and provide the output signals to the pixel array.

Figure 2:
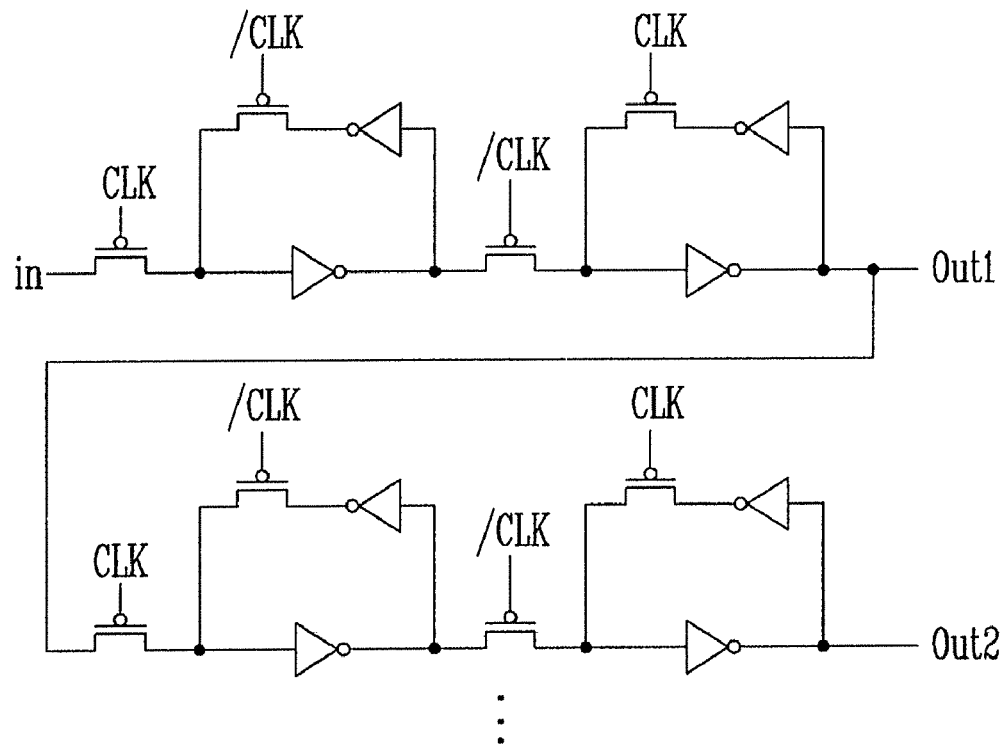
FIG. 2 is a circuit diagram of a stage in the scan driving circuit shown in FIG. 1.
Figure 3:
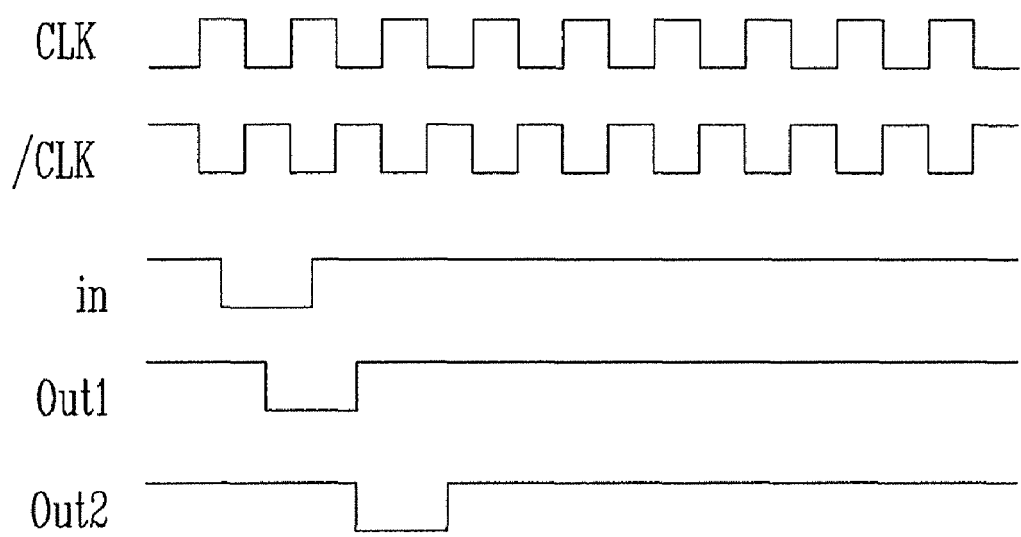
FIG. 3 is a timing diagram of the stage shown in FIG. 2.

FIG. 2 is a circuit diagram of a stage in the scan driving circuit shown in FIG. 1. FIG. 3 is a timing diagram of the stage shown in FIG. 2. Referring to FIG. 2 and FIG. 3, conventionally, each stage of a scan driving circuit uses a master-slave flip-flop. When a clock CLK is at a low level, such a flip-flop continues to receive an input and maintains a previous output.

In contrast to this, when the clock CLK is at a high level, the flip-flop maintains an input received at an input terminal In received when the clock CLK is at the low level, and outputs the received input but no longer receives the input shown.

Figure 2A:
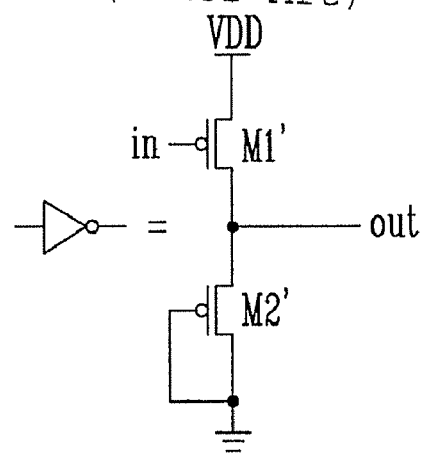
FIG. 2A is a circuit diagram of one of the inverters shown in FIG. 2.

In the aforementioned circuit, an inverter included in the flip-flop shown in FIG. 2A has a problem in that a static current flows when an input thereof is at a low level. Furthermore, in the flip-flop, the number of inverters having received a high-level input is the same number as that of inverters having received a low-level input. Accordingly, the static current flows through a half of all the inverters M1' and M2' in the flip-flop, thereby causing power consumption to be increased.

In addition, in the circuit of FIG. 2A, a voltage value due to a ratio of resistance (i.e., the transistors M1' and M2') connected between a power supply VDD and a ground GND determines a high level of an output voltage out. Low level of the output voltage out is set to be greater than that of the ground GND by a threshold voltage of the transistor M2'.

By way of example, due to characteristic deviations of the transistors, since levels of an input voltage are different according to respective stages, in the case where the circuits of FIGS. 2 and 2A are used, the deviation occurs when the output voltage is at a high level, with the result that the circuit may be erroneously operated.

Moreover, the deviation in a low level of the output voltage causes a deviation in on-resistance of an input transistor of an inverter included in the circuit of FIG. 2 to occur, thereby weighting a deviation in a high level of the output voltage. In particular, since a panel of an organic light emitting display uses a transistor having a great characteristic deviation, such a problem is more serious.

Further, in the inverter, an electric current flows through an input transistor to charge an output terminal, whereas the electric current flows through a load transistor to discharge the output terminal. Upon a charge of the output terminal, a source-gate voltage of the load transistor is gradually reduced, and a discharge current is accordingly reduced rapidly. This causes the discharge efficiency to be deteriorated.

Figure 4:
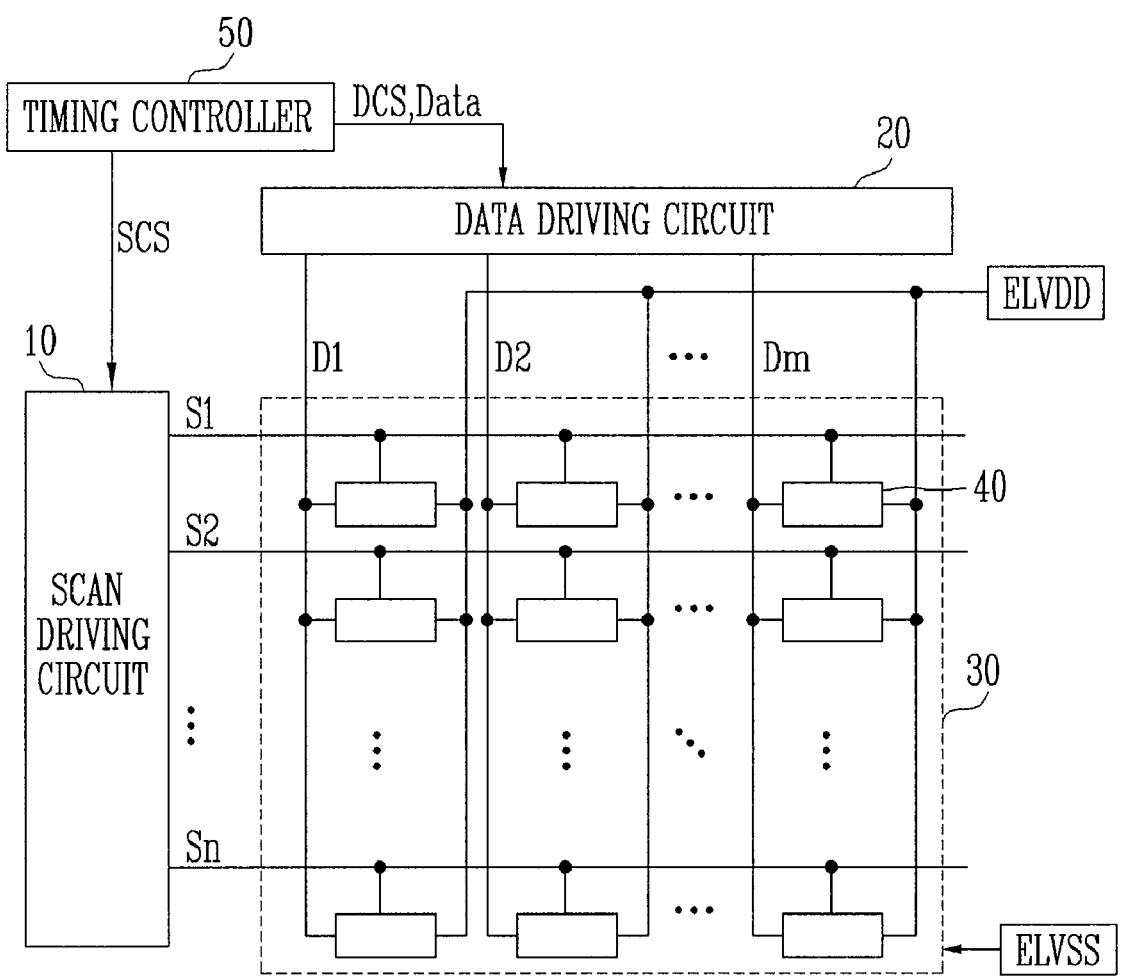
FIG. 4 is a block diagram showing an organic light emitting display according to an embodiment of the present invention.

FIG. 4 is a block diagram showing an organic light emitting display according to an embodiment of the present invention. With reference to FIG. 4, the organic light emitting display includes a display region 30, a scan driving circuit 10, a data driving circuit 20, and a timing controller 50.

The display region 30 includes a plurality of pixels 40 formed at crossing areas of scan lines S1 to Sn, and data lines D1 to Dm. The scan driving circuit 10 drives the scan lines S1 to Sn. The data driving circuit 20 drives the data lines D1 to Dm. The timing controller 50 controls the scan driving circuit 10 and the data driving circuit 20.

The timing controller 50 generates a data drive control signal DCS and a scan drive control signal SCS according to externally supplied synchronous signals. The data drive control signal DCS generated by the timing controller 50 is provided to the data driving circuit 20, and the scan drive control signal SCS is provided to the scan driving circuit 10. Furthermore, the timing controller 50 provides externally supplied data Data to the data driving circuit 20.

The data driving circuit 20 receives the data drive control signal DCS from the timing controller 50. Upon the receipt of the data drive control signal DCS, the data driving circuit 20 generates data signals, and provides the generated data signals to the data lines D1 to Dm. In this embodiment, the data driving circuit 20 provides the generated data signals to the data lines D1 to Dm every one horizontal period.

The display region 30 receives a first power from a first power supply ELVDD and a second power from a second power supply ELVSS from an exterior source, and provides them to the pixels 40. Upon the receipt of the first power and the second power, the pixels 40 control an amount of current that flows into the second power supply ELVSS from the first power supply ELVDD through a light emitting element corresponding to the data signal, thus generating light corresponding to the data signal.

The scan driving circuit 10 generates a scan signal in response to a scan drive control signal SCS from the timing controller 50, and sequentially provides the generated scan signal to the scan lines S1 to Sn. That is, the scan driving circuit 10 sequentially generates the scan signal to drive the plurality of pixels, and provide the scan signal to the display region 10.

Hereinafter, a construction and an operation of the scan driving circuit of an organic light emitting display according to an embodiment of the present invention will be explained.

Figure 5:
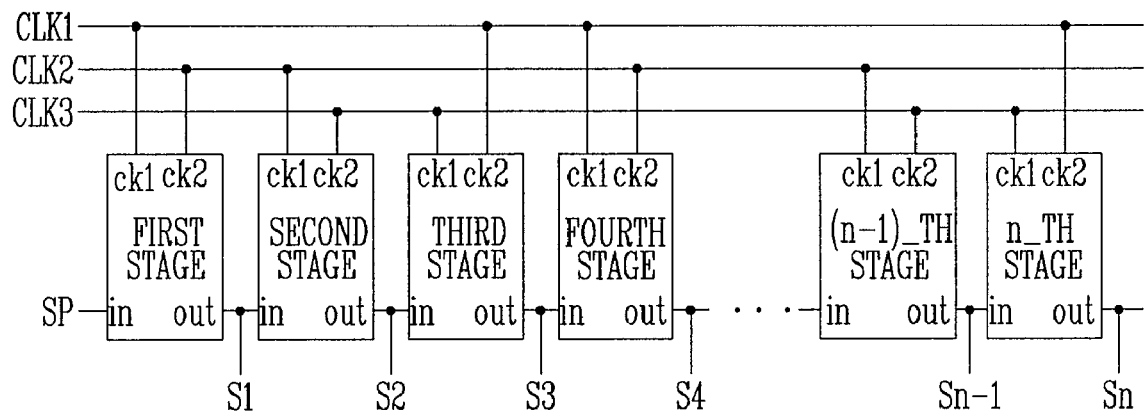
FIG. 5 is a block diagram showing a construction of a scan driving circuit according to an embodiment of the present invention.

FIG. 5 is a block diagram showing a configuration of a scan driving circuit according to an embodiment of the present invention. Referring to FIG. 5, the scan driving circuit in one embodiment of the present invention includes n stages that are dependently connected with a start pulse input line so as to drive an m×n pixel array.

First output lines of the first n stages are connected with first n row lines corresponding to the scan lines S1 to Sn included in the pixel array. A start pulse SP is supplied to a first stage. Output signals of first to n−1th stages are provided to next stages as a start pulse, respectively. Each stage receives and operates according to a first clock CLK1 and a second clock CLK2, the second clock CLK2 and a third clock CLK3 or the first clock CLK1 and the third clock CLK3. Each stage includes a first clock terminal ck1 and a second clock terminal ck2. In the embodiment shown, the first clock CLK1 and the second clock CLK2 are supplied to the first clock terminal ck1 and the second clock terminal ck2 of a (3k−2)-th stages. The second clock CLK2 and the third clock CLK3 are supplied to the first clock terminal ck1 and the second clock terminal ck2 of a (3k)-th stages. The first clock CLK1 and the third clock CLK3 are supplied to the second clock terminal ck2 and the first clock terminal ck1 of a (3k−2)-th stages. Here, k is a natural number.

That is, each stage operates in response to two clocks selected from the first clock CLK1, the second clock CLK2 and the third clock CLK3, but does not operate in response to merely one clock.

Further, when the first stage outputs a signal in response to the first and second clocks, the second stage receives and operates according to the second and third clocks. When the second stage outputs a signal in response to the second and third clocks, the third stage receives and operates according to the third and first clocks. That is, the first, second, and third stages sequentially output the signal to sequentially drive a display region of an organic light emitting display by scan lines.

An external control circuit (not shown) provides the input signals of the driving circuit, that is, a start pulse SP, the first clock, the second clock and the third clock, CLK1, CLK2 and CLK3, and a supply voltage VDD.

Figure 6:
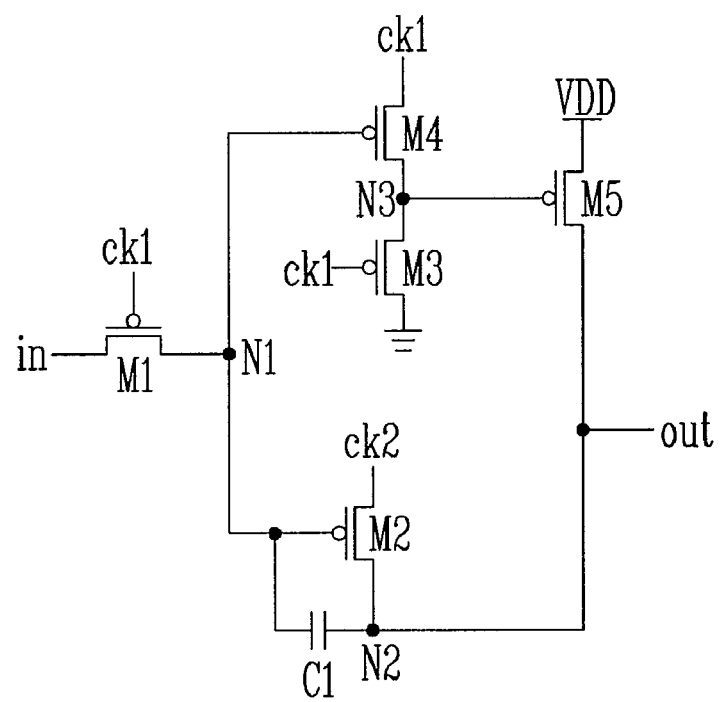
FIG. 6 is a circuit diagram showing a first embodiment of a stage of the scan driving circuit shown in FIG. 5.
Figure 7:
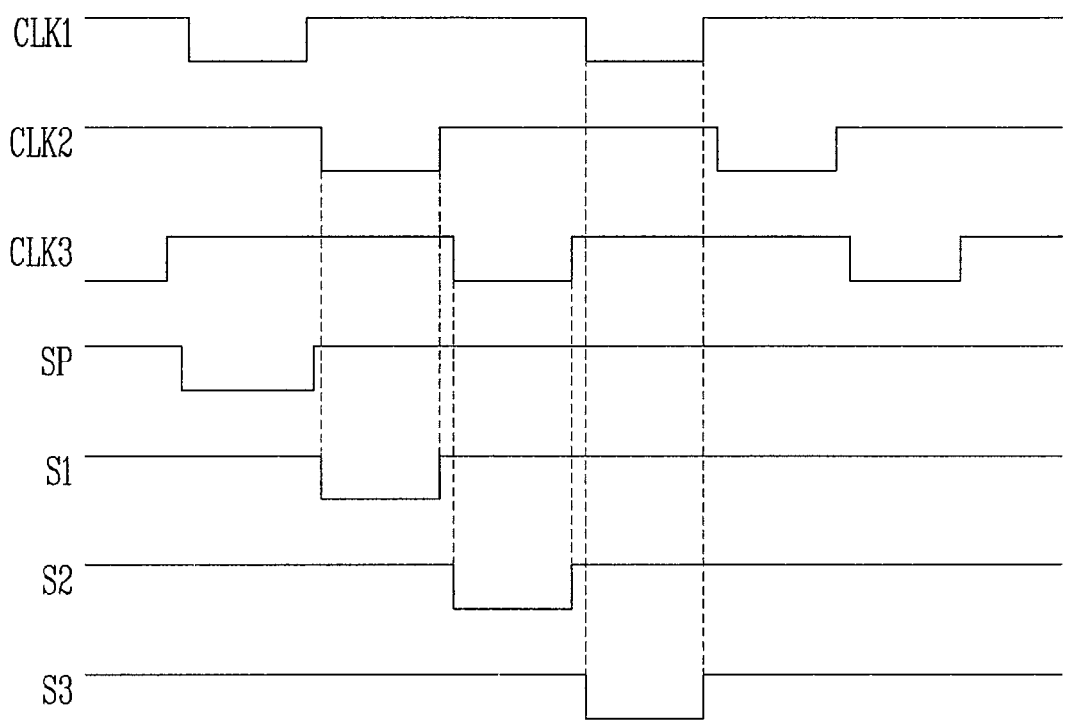
FIG. 7 is a timing diagram showing a first embodiment of an input/output waveform of the stage shown in FIG. 6.

FIG. 6 is a circuit diagram showing a first embodiment of a stage of the scan driving circuit shown in FIG. 5. FIG. 7 is a timing diagram showing a first embodiment of an input/output waveform of the stage shown in FIG. 6.

As shown in FIG. 6, in this embodiment of the present invention, transistors included in each stage are all PMOS transistors, and sequentially send a low level output through the scan driving circuit. Namely, the scan driving circuit of the present invention outputs a high level signal to a display region of an active matrix type display device such as an organic light emitting display for most of the time, and sequentially outputs a low level pulse through a plurality of stages as shown in FIGS. 6 and 7.

Referring to FIG. 6, the stage includes a first PMOS transistor M1, a second PMOS transistor M2, a third PMOS transistor M3, a fourth PMOS transistor M4, a fifth PMOS transistor M5, and a first capacitor C1. The first PMOS transistor M1 includes a gate connected with a first clock terminal ck1, receives an output voltage Si of a previous stage or a first start pulse SP, and selectively transfers the output voltage Si of a previous stage or the first start pulse SP to a first node N1. The second PMOS transistor M2 includes a gate connected to the first node N1, and is connected between the second clock terminal ck2 and a second node N2. The third PMOS transistor M3 includes a gate connected to the first clock terminal ck1, and is connected between a ground voltage source and a third node N3. The fourth PMOS transistor M4 includes a gate connected to the first node N1, and is connected between the first clock terminal ck1 and the third node N3. The fifth PMOS transistor M5 includes a gate connected to the third node N3, and is connected between a power supply VDD and the second node N2. The first capacitor C1 is connected between the first node N1 and the second node N2, and maintains a predetermined voltage.

Although it is shown that the ground voltage source VSS is embodied by a ground GND, it can be either ground or a negative voltage power supply.

Hereinafter, through a circuit arrangement of the (3k−2)-th stage among the stages shown in FIG. 5, the operation of the stages will be explained.

With reference to FIGS. 6 and 7, each stage of the scan driving circuit may divide one period into a precharge period, an evaluation period, and a quiescent period according to the first clock CLK1, the second clock CLK2, and the third clock CLK3. During the precharge period, the first clock CLK1 of a low level is inputted to a first clock terminal ck1 of the stage, the second clock CLK2 of a high level is inputted to the second clock terminal ck2. Further, a start pulse SP or a scan signal Si of a previous stage is inputted to the input clock terminal In. At this time, the first PMOS transistor M1 and the third PMOS transistor M3 are turned-on in response to a first clock to maintain the first node N1 and the third node N3 at a low level voltage. When the first node N1 becomes a low level, the second PMOS transistor M2 and the fourth PMOS transistor M4 are turned-on. When the second PMOS transistor M2 is turned-on, the capacitor C1 is charged with a voltage corresponding to a difference between voltages of the first node N1 and the second node N2. Further, when the fourth transistor M4 is turned-on, a voltage of the first clock CLK1 is inputted to the third node N3. Consequently, the fifth PMOS transistor M5 is turned-on to output a drive voltage to an output terminal out.

During the evaluation period, a first clock CLK1 of a high level is inputted to the first clock terminal ck1, and a second clock CLK2 of a low level is inputted to the second clock terminal ck2. At this time, the first PMOS transistor M1 is turned-on and becomes a floating-state, so that the first node N1 maintains a previous voltage by the capacitor C1. Accordingly, the second PMOS transistor M2 and the fourth PMOS transistor M4 are turned-on. When the fourth PMOS transistor M4 is turned-on, the first clock CLK1 transferred to the first clock terminal ck1 becomes a high level, with the result that the fifth PMOS transistor M5 is turned-off. Further, when the second PMOS transistor M2 is turned-on, a voltage of the second node N2 is varied according to a voltage of the second clock CLK2, with the result that a voltage of the output terminal has the same waveform as that of the second clock CLK2. In addition, since a drive voltage from a power supply VDD is not transferred to the output terminal out by the fifth PMOS transistor M5, a voltage of the output terminal changes according to a voltage of the second node N2.

Finally, the quiescent period indicates when the third clock CLK3 has a low level. During the quiescent period, a first clock CLK1 and a second clock CLK2 of high level are transferred to the stage, whereas the third clock CLK3 is not transferred thereto. At this time, the output terminal maintains a high level voltage.

Moreover, when the second clock CLK2 again becomes a low level, the first node N1 has a high level voltage by a capacitor, and the output terminal also maintains a high level voltage. Furthermore, in a state that the start pulse SP or the scan signal Si of a previous stage are not transferred through an input terminal In, when the first and second clocks of low level are transferred, the first node N1 maintains a high level voltage, and the second PMOS transistor M2 and the fifth PMOS transistor M5 are turned-off. Accordingly, a voltage of the output terminal depends on a voltage of the second node N2, and the second PMOS transistor M2 is turned-off, so that a voltage of the second node N2 maintains a high level without variation.

Consequently, when a low level signal is not inputted to an input terminal In of each stage, the output terminal out maintains a high level signal, so that each stage receives an output low level signal of the previous stage and outputs a low level signal that results in a sequential output of the scan signal.

Figure 8:
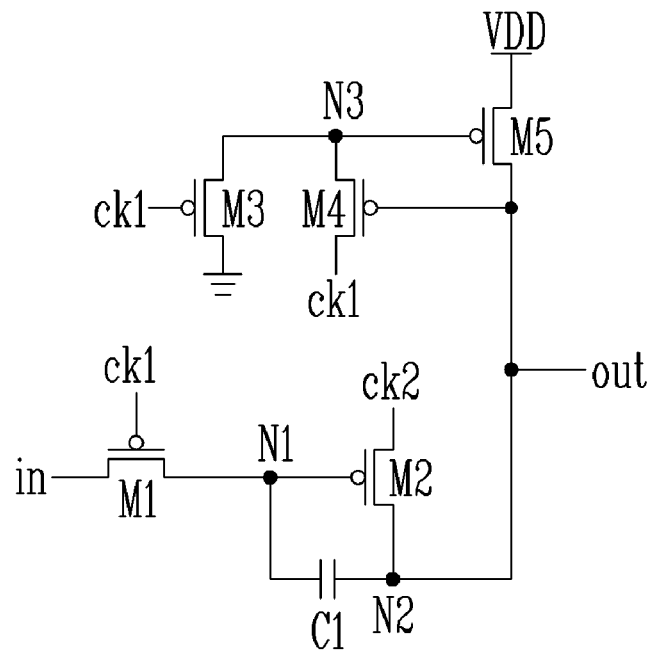
FIG. 8 is a circuit diagram showing a second embodiment of a stage of the scan driving circuit shown in FIG. 5.

FIG. 8 is a circuit diagram showing a second embodiment of a stage of the scan driving circuit shown in FIG. 5. Referring to FIG. 8, the second embodiment of the stage includes a first PMOS transistor M1, a second PMOS transistor M2, a third PMOS transistor M3, a fourth PMOS transistor M4, a fifth PMOS transistor M5, and a capacitor C1.

The first PMOS transistor M1 transfers an input signal to the first node N1 in response to the second clock CLK2, and the second PMOS transistor M2 transfers the third clock CLK3 to the second node N2 corresponding to a voltage of the first node N1. The third PMOS transistor M3 transfers a ground voltage to a gate of the fifth transistor PMOS M5 in response to the first clock CLK1. A gate of the fourth PMOS transistor M4 is connected to the output terminal out, and the fourth transistor M4 transfers the first clock CLK1 to a gate of the fifth PMOS transistor M5 corresponding to a voltage of the output terminal out. Further, the fifth PMOS transistor M5 transfers a voltage of a power supply VDD to the output terminal corresponding to a voltage of a gate thereof. Moreover, the capacitor C1 is connected between the first node N1 and the second node N2, and maintains a predetermined voltage.

The stage having the construction as described above receives and operates according to the first clock and the second clock CLK1 and CLK2 among the first clock, the second clock and the third clock, CLK1, CLK2 and CLK3 shown in FIG. 7. When the first clock CLK1 is low, the stage operates in a precharge mode. When the second clock CLK2 is low, the stage operates in an evaluation mode. When the third clock CLK3 is low, the stage operates in a quiescent mode.

Figure 9:
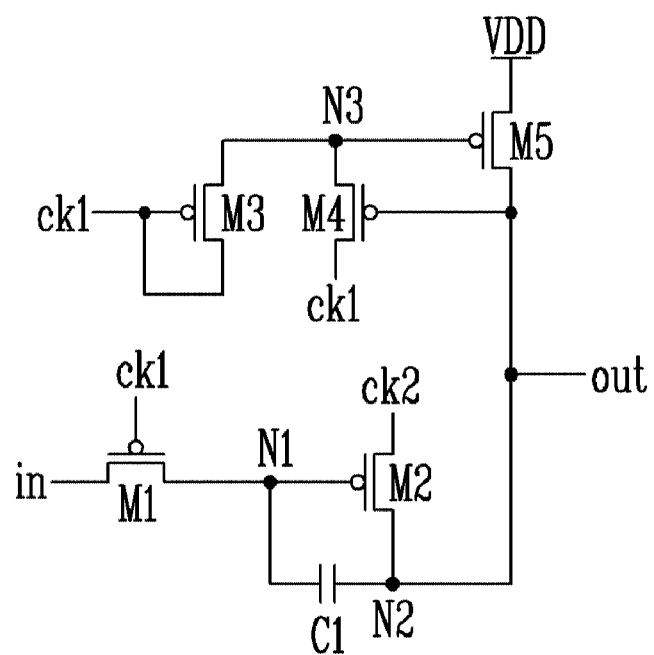
FIG. 9 is a circuit diagram showing a third embodiment of a stage of the scan driving circuit shown in FIG. 5.

FIG. 9 is a circuit diagram showing a third embodiment of a stage of the scan driving circuit shown in FIG. 5. In the stage shown in FIG. 9, the stage has substantially the same functions as that of FIG. 8. The difference between the stage of FIG. 9 from that of the stage of FIG. 8 is that the first clock CLK1 is transferred to a source and a gate of the third PMOS transistor M3. Accordingly, when the first clock CLK1 has a low level, the fifth PMOS transistor M5 is turned-on. Since all other components of the stage in FIG. 9 are arranged in substantially the same manner as the corresponding components of FIG. 8, they will not be described in detail.

Figure 10A:
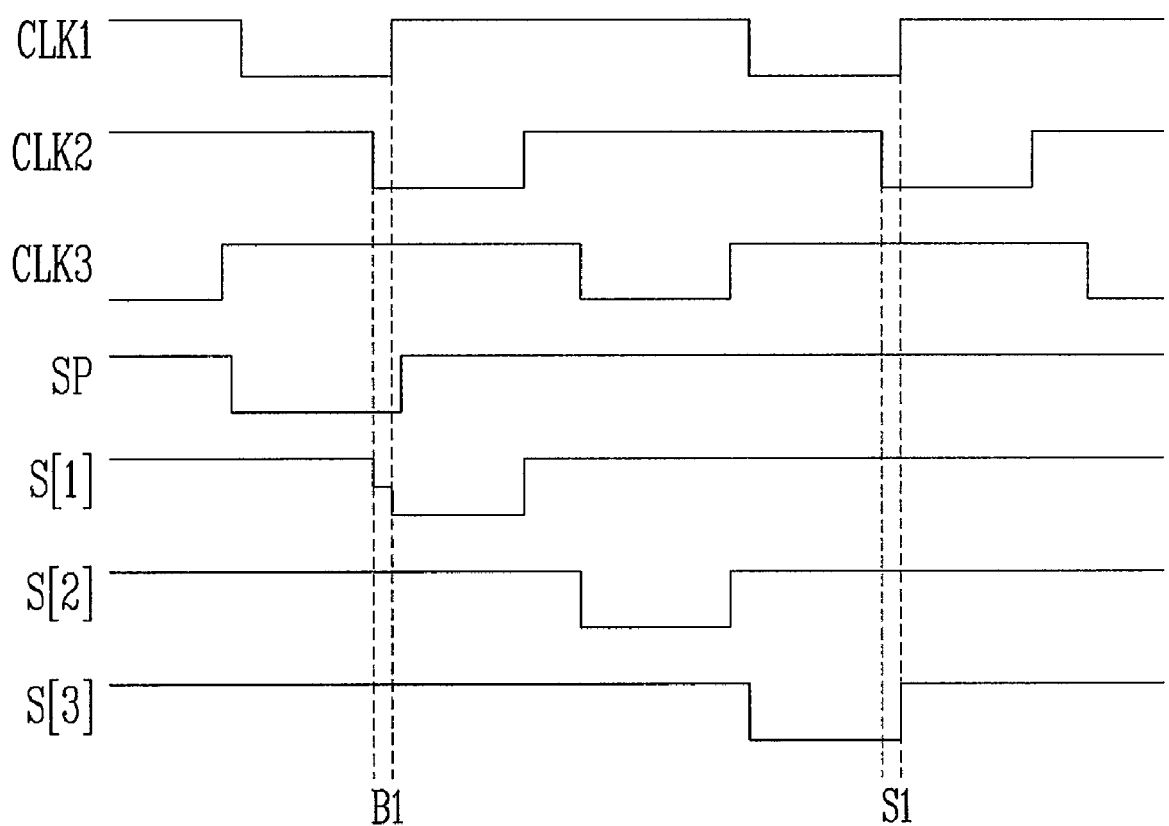

FIG. 10A and FIG. 10B are timing diagrams showing a second embodiment and a third embodiment, respectively, of input/output waveforms of the stages shown in FIG. 8 and FIG. 9, respectively. FIG. 10A and FIG. 10B show operations of the stage when at least two of the first clock, the second clock and the third clock, CLK1, CLK2 and CLK3 overlap with each other by external influences. FIG. 10A indicates an operation of the stage when the first clock and the second clock, CLK1 and CLK2 overlap with each other. FIG. 10B indicates an operation of the stage when the first clock, the second clock and the third clock, CLK1, CLK2 and CLK3 overlap with each other.

In the case of FIG. 10A, when the first clock and the second clock, CLK1 and CLK2 overlap with each other due to an erroneous operation of the second clock CLK2, they do not overlap with the third clock CLK3 of a normal operation. Accordingly, since the first clock and the second clock, CLK1 and CLK2 overlap with each other, a start part of a scan signal that a first stage outputs is distorted. However, because the second clock and the third clock, CLK2 and CLK3 overlap with each other, a second stage outputs a scan signal, which is not distorted. Further, the third clock CLK3 and a first clock CLK1 of the second time do not overlap with each other, in the event that a third stage outputs a scan signal, which is not distorted.

In the case of FIG. 10B, when the first clock and the second clock, CLK1 and CLK2 overlap with each other, and the second clock and the third clock, CLK2 and CLK3 overlap with each other, the third clock CLK3 and a first clock CLK1 of the second time do not overlap with each other. Accordingly, the start parts of output scan signals of the first stage and the second stage are distorted, whereas an output scan signal of the third stage is not distorted.

As a result, the scan signal appears to have a normal waveform periodically, so that a difference between a waveform of a scan signal inputted to a first scan line and a waveform of a scan signal inputted to a second scan line is not great.

Figure 11:
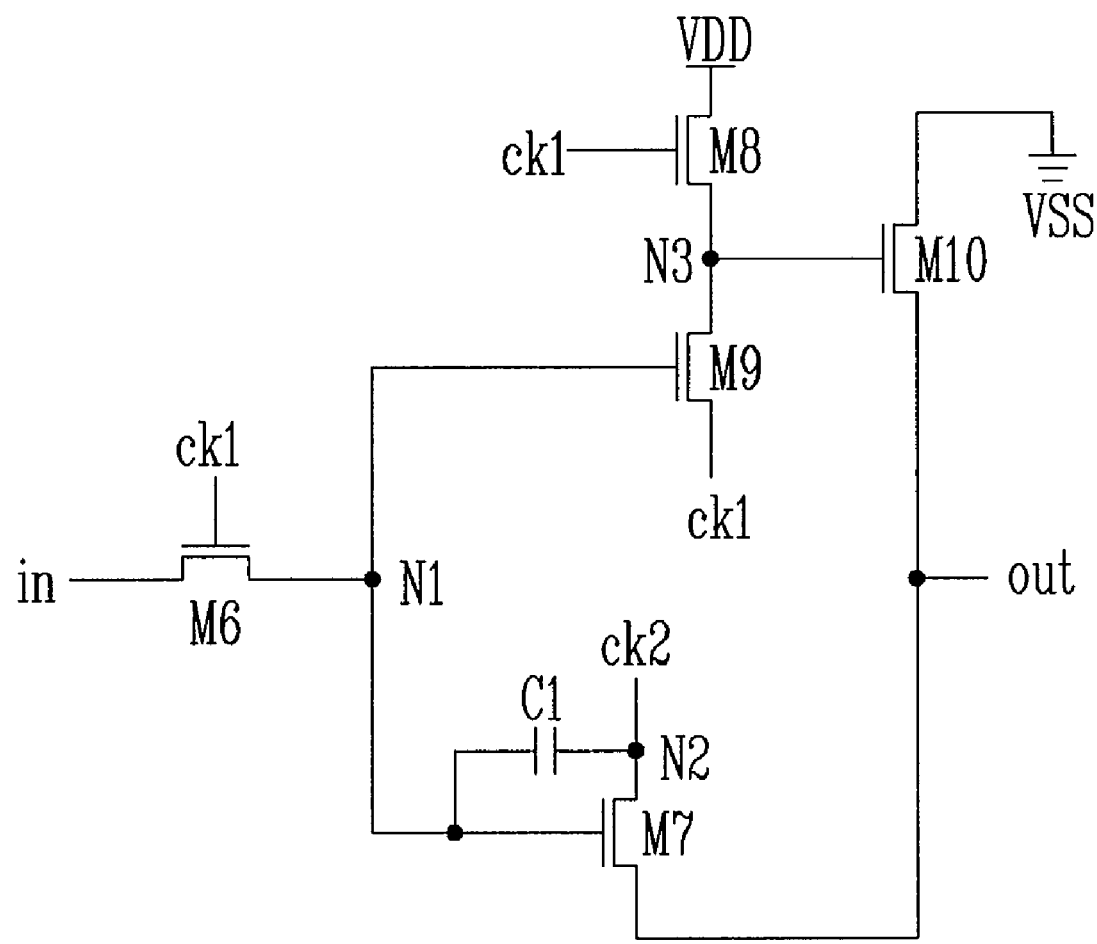
FIG. 11 is a circuit diagram showing a fourth embodiment of a stage of the scan driving circuit shown in FIG. 5.
Figure 12:
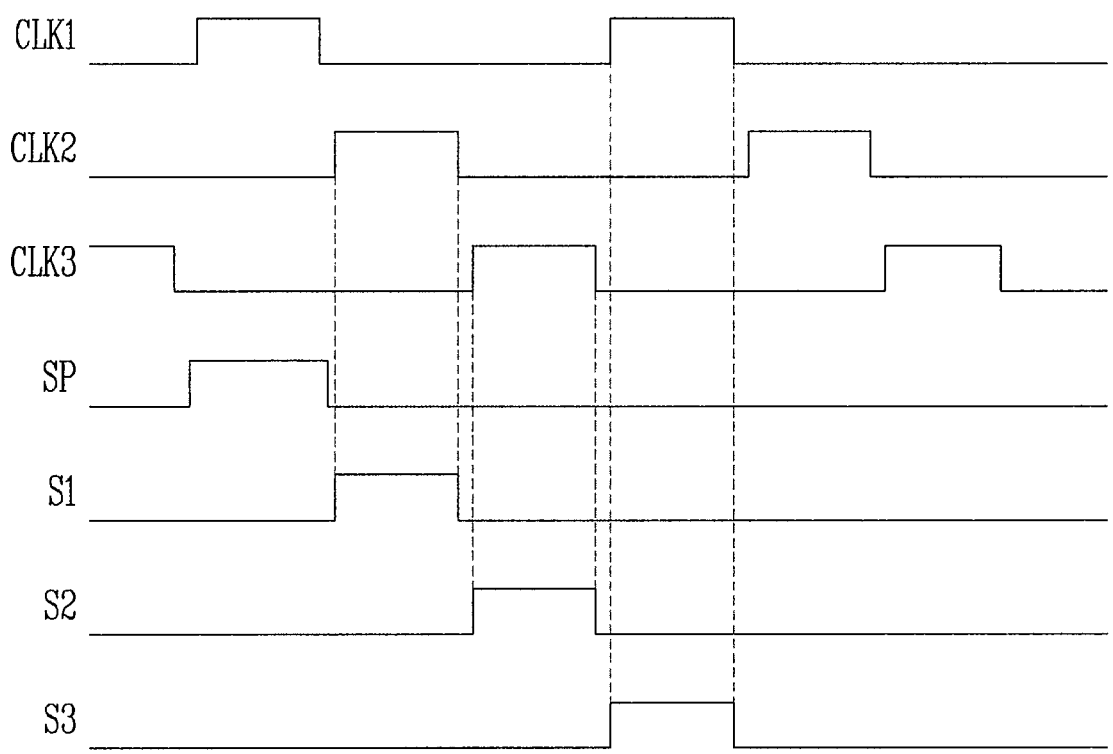
FIG. 12 is a timing diagram of the stage shown in FIG. 11.
Figure 3:
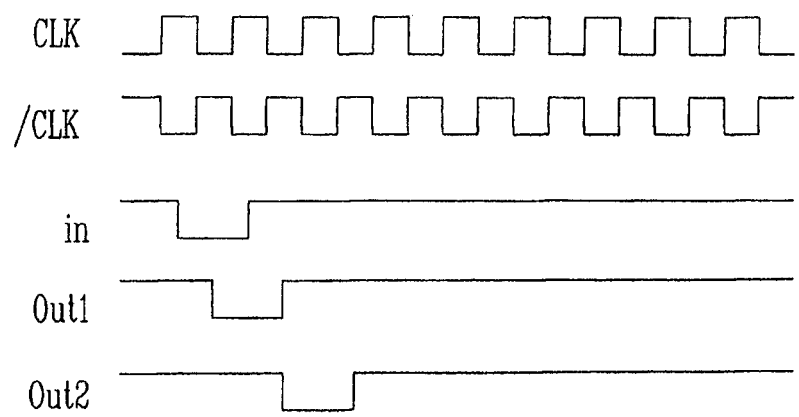

FIG. 11 is a circuit diagram showing a fourth embodiment of a stage of the scan driving circuit shown in FIG. 5. FIG. 12 is a timing diagram of the stage shown in FIG. 11. With reference to FIG. 11, the stage is formed of NMOS transistors. The fourth embodiment of the stage includes a first NMOS transistor M6, a second NMOS transistor M7, a third NMOS transistor M8, a fourth NMOS transistor M9, a fifth NMOS transistor M10 and a capacitor C1. Each stage of FIG. 11 and FIG. 12 has similar construction to that of FIG. 6, and operates to have a precharge period, an evaluation period and a quiescent period.

Since the scan driving circuit and an organic light emitting display using the same in exemplary embodiments according to the present invention switch an output voltage from a positive source voltage to a negative source voltage, an operation speed may be increased. Furthermore, even if a clock transferred to the scan driving circuit is erroneously operated, a change of a waveform of a scan signal may be not great.

Although exemplary embodiments of the present invention have been shown and described, it would be appreciated by those skilled in the art that changes might be made in these embodiments without departing from the principles and spirit of the invention, the scope of which is defined in the claims and their equivalents.

What is claimed is:

1. A scan driving circuit comprising:
a plurality of stages each configured to receive two of three clocks, to receive an input signal through an input terminal, to delay the input signal, and to output an output signal through an output terminal, wherein the input terminal of each of the plurality of stages is connected to the output terminal of a previous one of the stages, wherein each of the plurality of stages comprises:
a switch for providing the input signal of the input terminal to a first node according to a first clock among the three clocks;
a first clock terminal for receiving the first clock;
a switch section for coupling a first voltage source to the output terminal according to the first clock and the input signal, the switch section comprising:
a first transistor comprising a gate connected to the first clock terminal, a drain connected to a second voltage source, and a source connected to a second node;
a second transistor comprising a gate connected to the first node, a source connected to the first clock terminal, and a drain connected to the second node; and
a third transistor comprising a gate connected to the second node, a source connected to the first voltage source, and a drain connected to the output terminal; and
a storage section for maintaining a voltage of the output terminal for a predetermined time, and for providing a voltage of a second clock from among the three clocks to the output terminal according to the input signal.

2. The scan driving circuit as claimed in claim 1, wherein the storage section comprises:
a fourth transistor connected to the switch for providing the second clock to the output terminal according to a voltage of the first node; and
a capacitor for maintaining a voltage between the first node and the output terminal.

3. The scan driving circuit as claimed in claim 1, wherein the second voltage source has a ground voltage.

4. The scan driving circuit as claimed in claim 1, wherein the plurality of stages are configured to operate during a precharge period, an evaluation period, and a quiescent period, wherein each of the plurality of stages is configured to receive the input signal in response to the first clock during the precharge period, to output to the output terminal a voltage corresponding to the second clock during the evaluation period, and to output a signal stored in the storage section while a third clock from among the three clocks is generating.

5. The scan driving circuit as claimed in claim 4, wherein each of the plurality of stages is configured to operate in an input period when the previous one of the stages outputs a scan signal.

6. The scan driving circuit as claimed in claim 1, wherein the first voltage source is a drive power source.

7. A scan driving circuit comprising:
a plurality of stages, each configured to receive two of three clocks, to receive an input signal through an input terminal, to delay the input signal, and to output an output signal through an output terminal, wherein the input terminal of each of the plurality of stages is connected to the output terminal of a previous one of the stages, wherein each of the plurality of stages comprises:
a first transistor for providing the input signal of the input terminal to a first node according to a first clock from among the three clocks;
a first clock terminal for receiving the first clock;
a switch section for coupling a first voltage source to the output terminal according to the first clock, the switch section comprising
a second transistor comprising a gate connected to the first clock terminal, a drain connected to a second voltage source, and a source connected to a second node;
a third transistor comprising a gate connected to the first node, a source connected to the first clock terminal, and a drain connected to the second node; and
a fourth transistor comprising a gate connected to the second node, a source connected to the first voltage source, and a drain connected to the output terminal; and
a storage section for maintaining a voltage of the output terminal for a predetermined time, and for providing a voltage of a second clock from among the three clocks to the output terminal according to the input signal.

8. The scan driving circuit as claimed in claim 7, wherein the storage section comprises:
a fifth transistor connected to the first transistor, the fifth transistor for providing the second clock to the output terminal according to a voltage of the first node; and
a capacitor for maintaining a voltage between the first node and the output terminal.

9. The scan driving circuit as claimed in claim 7, wherein the plurality of stages are configured to operate during a precharge period, an evaluation period, and a quiescent period, wherein each of the plurality of stages is configured to receive the input signal in response to the first clock during the precharge period, to output to the output terminal a voltage corresponding to the second clock during the evaluation period, and to output a signal stored in the storage section while a third clock from among the three clocks is generating.

10. The scan driving circuit as claimed in claim 9, wherein one of the plurality of stages is configured to operate in an input mode when a previous stage outputs a scan signal.

11. An organic light emitting display comprising:
a display region having a plurality of pixels for displaying an image;
a data driving circuit for transferring a data signal to the display region; and
a scan driving circuit for transferring a scan signal to the display region, wherein the scan driving circuit comprises:
a plurality of stages, each configured to receive two of three clocks, to receive an input signal through an input terminal, to delay the input signal, and to output an output signal through an output terminal, wherein the input terminal of each of the plurality of stages is connected to the output terminal of a previous one of the stages, wherein each of the plurality of stages comprises:
a first transistor for providing the input signal of the input terminal to a first node according to a first clock from among the three clocks;
a first clock terminal for receiving the first clock;

a switch section for coupling a first voltage source to the output terminal according to the first clock and the input signal, the switch section comprising:

a second transistor comprising a gate connected to the first clock terminal, a drain connected to a second voltage source, and a source connected to a second node;

a third transistor comprising a gate connected to the first node, a source connected to the first clock terminal, and a drain connected to the second node; and a fourth transistor comprising a gate connected to the second node, a source connected to the first voltage source, and a drain connected to the output terminal;

a storage section for maintaining a voltage of the output terminal for a predetermined time, and for providing a voltage of a second clock from among the three clocks to the output terminal according to the input signal.

12. The organic light emitting display as claimed in claim 11, wherein the plurality of stages are configured to operate during a precharge period, an evaluation period, and a quiescent period, wherein each of the plurality of stages is configured to receive the input signal in response to the first clock during the precharge period, to output a voltage corresponding to the second clock to the output terminal during the evaluation period, and to output a signal stored in the storage section while a third clock from among the three clocks is generating.

13. The organic light emitting display as claimed in claim 11, wherein one of the plurality of the stages is configured to operate in an input period when the previous one of the stages outputs the scan signal.

* * * * *

UNITED STATES PATENT AND TRADEMARK OFFICE
CERTIFICATE OF CORRECTION

Page 1 of 2

PATENT NO.         : 7,920,118 B2
APPLICATION NO.    : 11/692880
DATED              : April 5, 2011
INVENTOR(S)        : Shin It is certified that error appears in the above-identified patent and that said Letters Patent is hereby corrected as shown below:

In the Drawings

Fig. 3, Sheet 3 of 11

Delete Drawing Sheet 3 and substitute therefore the Drawing Sheet, consisting of FIG. 3, as shown on the attached page.

ABOVE "FIG. 3"
Insert -- (Prior Art) --

Signed and Sealed this
Tenth Day of April, 2012

David J. Kappos
*Director of the United States Patent and Trademark Office*